United States Patent
Nuraje et al.

(10) Patent No.: US 10,456,774 B2
(45) Date of Patent: Oct. 29, 2019

(54) BIOTEMPLATED PEROVSKITE NANOMATERIALS

(71) Applicant: Massachusetts Institute of Technology, Cambridge, MA (US)

(72) Inventors: Nurxat Nuraje, Brooklyn, NY (US); Angela M. Belcher, Lexington, MA (US); Yu Lei, Waltham, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 15/630,727

(22) Filed: Jun. 22, 2017

(65) Prior Publication Data

US 2018/0133693 A1    May 17, 2018

Related U.S. Application Data

(63) Continuation of application No. 13/860,184, filed on Apr. 10, 2013, now abandoned.

(Continued)

(51) Int. Cl.

| | | |
|---|---|---|
| *B01J 23/60* | (2006.01) | |
| *H01L 31/032* | (2006.01) | |
| *C30B 7/14* | (2006.01) | |
| *B01J 23/843* | (2006.01) | |
| *B01J 27/24* | (2006.01) | |

(Continued)

(52) U.S. Cl.
CPC ............ *B01J 23/60* (2013.01); *B01J 23/002* (2013.01); *B01J 23/02* (2013.01); *B01J 23/20* (2013.01); *B01J 23/8437* (2013.01); *B01J 27/24* (2013.01); *B01J 35/002* (2013.01); *B01J 35/004* (2013.01); *B01J 35/006* (2013.01); *B01J 35/0013* (2013.01); *B82Y 30/00* (2013.01); *C01B 3/042* (2013.01); *C30B 7/00* (2013.01); *C30B 7/14* (2013.01); *C30B 29/24* (2013.01); *C30B 29/30* (2013.01); *C30B 29/32* (2013.01); *C30B 31/06* (2013.01); *H01L 31/032* (2013.01);

(Continued)

(58) Field of Classification Search
CPC .......... B01J 23/60; B01J 23/002; B01J 23/02; B01J 23/8437; B01J 27/24; B01J 35/0013; B01J 35/002; B01J 35/004; B01J 35/006; B82Y 30/00; C01B 3/042; C30B 7/00; C30B 7/14; C30B 29/24; C30B 29/30; C30B 31/07; C30B 31/032; H01L 31/0324; Y10T 428/2982; Y02E 60/364

See application file for complete search history.

(56) References Cited

U.S. PATENT DOCUMENTS

| | | |
|---|---|---|
| 1,524,678 A | 2/1925 | Tinsley |
| 4,812,300 A * | 3/1989 | Quinlan ................ B01J 23/002 423/404 |

(Continued)

FOREIGN PATENT DOCUMENTS

WO    WO-2011149996 A3 *  1/2012  ............ B01J 21/066

OTHER PUBLICATIONS

Dickerson et al., "Protein- and Peptide-Directed Syntheses of Inorganic Materials," Chem. Rev., Nov. 12, 2008, 108(11):4935-4978.

(Continued)

*Primary Examiner* — Richard M Rump
(74) *Attorney, Agent, or Firm* — Foley & Lardner LLP

(57) ABSTRACT

A biotemplated nanomaterial can include a crystalline perovskite.

12 Claims, 18 Drawing Sheets

Related U.S. Application Data

(60) Provisional application No. 61/622,242, filed on Apr. 10, 2012.

(51) Int. Cl.

| | | |
|---|---|---|
| *B01J 35/00* | (2006.01) | |
| *B82Y 30/00* | (2011.01) | |
| *C30B 7/00* | (2006.01) | |
| *C30B 29/24* | (2006.01) | |
| *C30B 29/30* | (2006.01) | |
| *C30B 29/32* | (2006.01) | |
| *C30B 31/06* | (2006.01) | |
| *C01B 3/04* | (2006.01) | |
| *B01J 23/00* | (2006.01) | |
| *B01J 23/02* | (2006.01) | |
| *B01J 23/20* | (2006.01) | |

(52) U.S. Cl.
CPC ........ *H01L 31/0324* (2013.01); *Y02E 60/364* (2013.01); *Y10T 428/2982* (2015.01)

(56) References Cited

U.S. PATENT DOCUMENTS

| | | |
|---|---|---|
| 2007/0157967 A1 | 7/2007 | Mershin et al. |
| 2009/0156427 A1 | 6/2009 | Zhang |
| 2009/0305437 A1 | 12/2009 | Allemand et al. |
| 2012/0041246 A1 | 2/2012 | Scher et al. |

OTHER PUBLICATIONS

International Search Report, PCT/US2013/035955, dated Jul. 18, 2013.

Mao et al., "Virus-based toolkit for the directed synthesis of magnetic and semiconducting nanowires," Science, Jan. 2004, 303.

Selbach et al., "Synthesis of $BiFeO_3$ by Wet Chemical Methods," J. Am. Ceram. Soc., Nov. 2007, 90(11):3430-3434.

Tao et al., "Bio-inspired nanofabrication of barium titanate," Journal of Materials Chemistry, Oct. 7, 2010, 20(37):7916-7923.

* cited by examiner

FIG. 2A
FIG. 2B
FIG. 2C
FIG. 2D
FIG. 2E
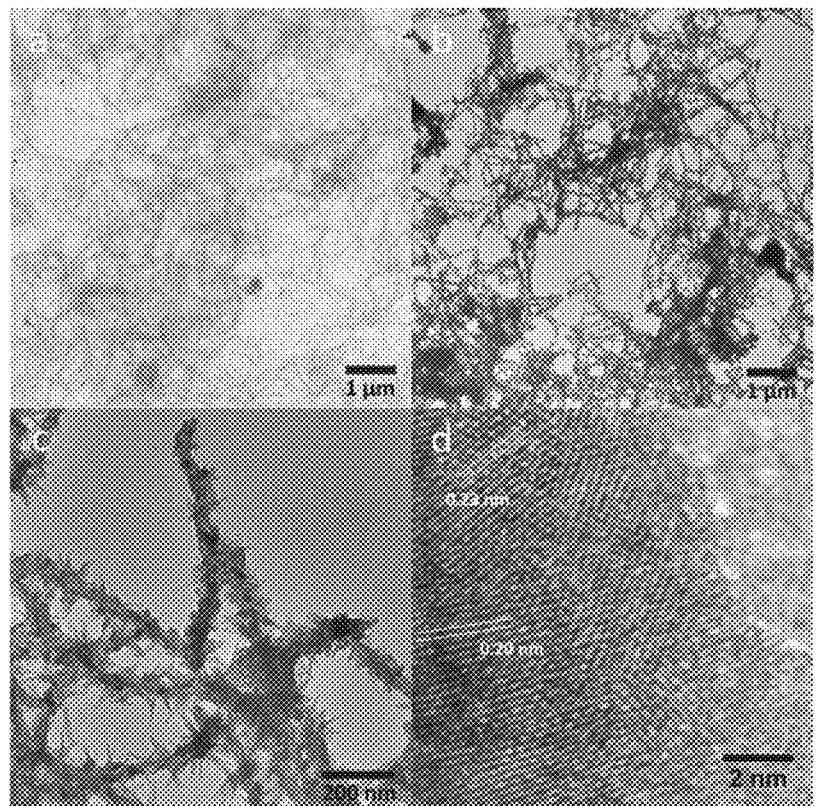
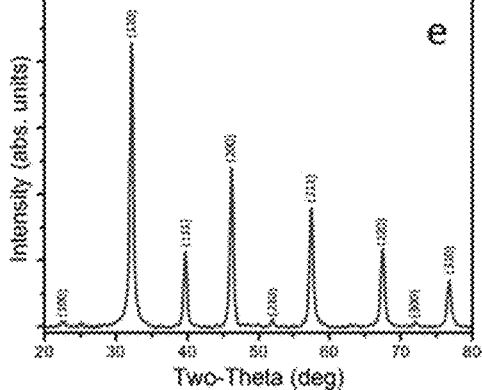

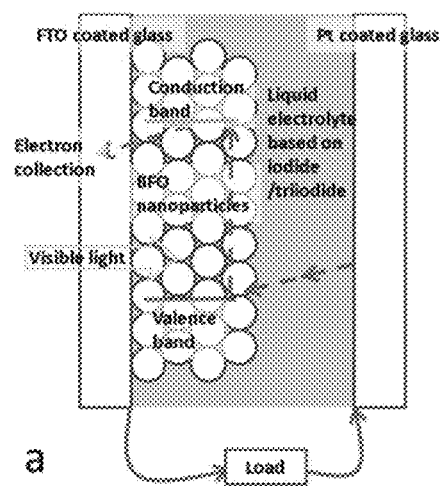 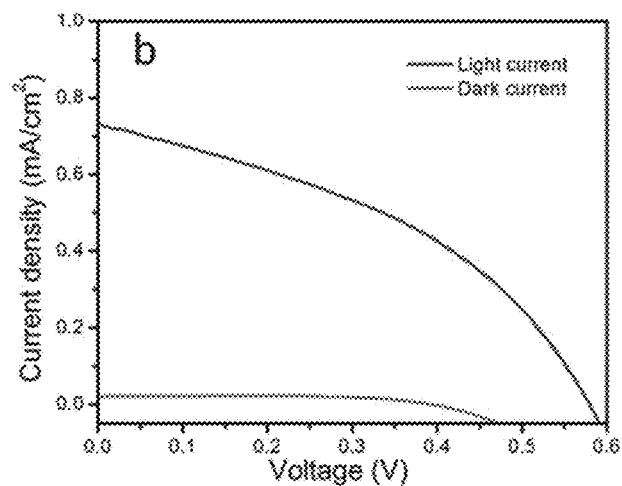
FIG. 14A                    FIG. 14B

Without Treatment
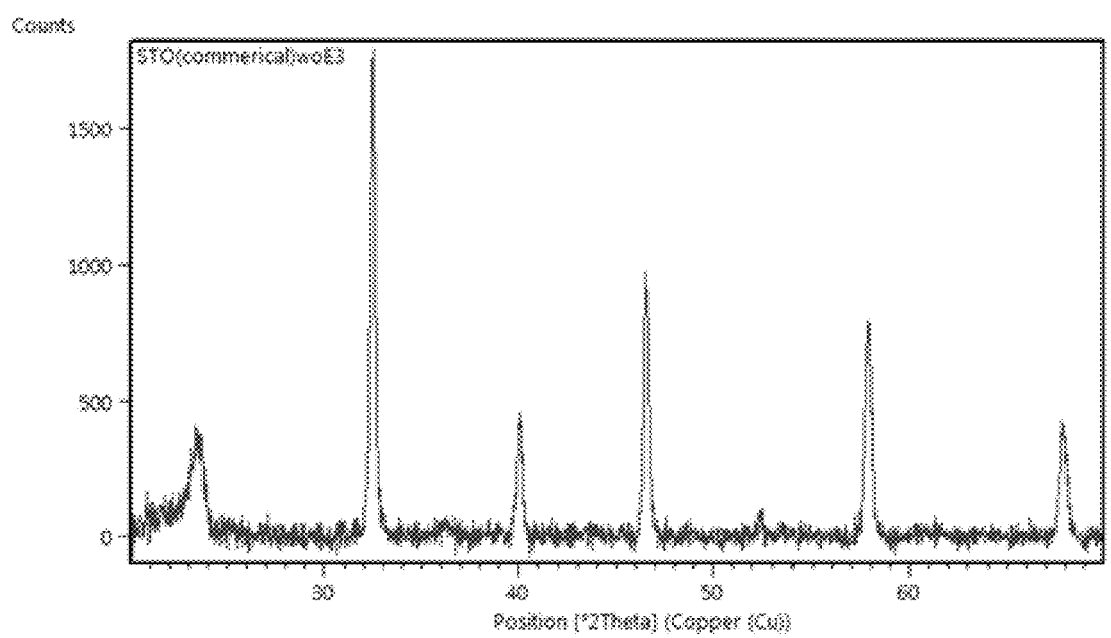
With NH3 Treatment at 700C
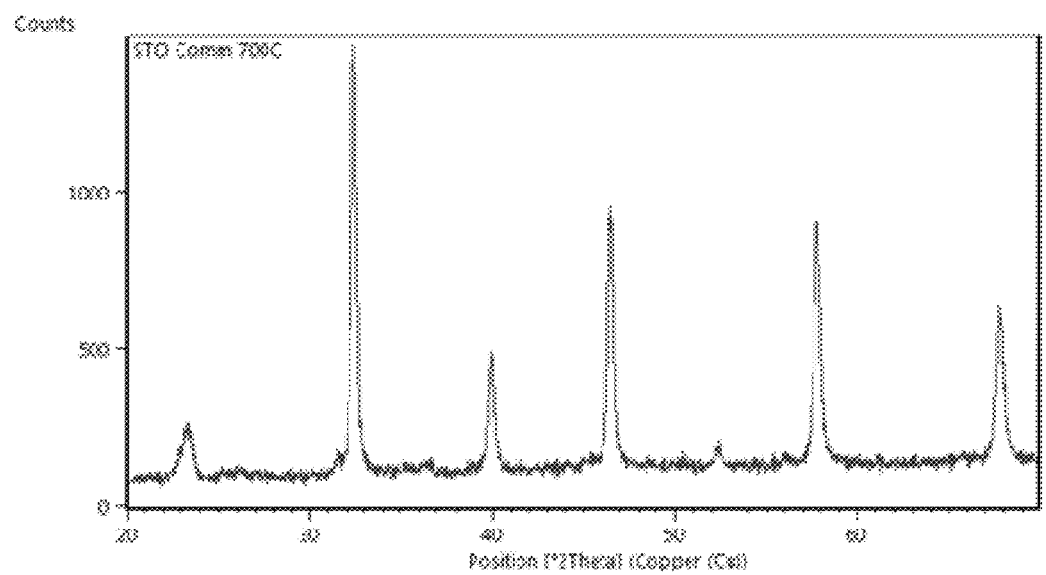
FIG. 17B

BIOTEMPLATED PEROVSKITE NANOMATERIALS

CLAIM OF PRIORITY

This application is a continuation of U.S. application Ser. No. 13/860,184 filed Apr. 10, 2013, which claims the benefit of prior U.S. Provisional Application No. 61/622,242, filed on Apr. 10, 2012, which is incorporated by reference in its entirety.

STATEMENT OF JOINT RESEARCH AGREEMENT

This present invention is related to a joint research agreement between Angela M. Belcher and Siluria Technologies, Inc.

TECHNICAL FIELD

This invention relates to biotemplated nanomaterials and methods of making and using them.

BACKGROUND

Perovskite materials have attracted wide-spread attention due to their catalytic, ferroelectric, and ferromagnetic properties as well as their application in superconductors, thermoelectrics, and fuel cells. Due to their unique ferroelectric and semiconductor properties, researchers are investigating the photovoltaic and photocatalytic properties of perovskite materials. Nanoscaled perovskite materials exhibit improved properties over bulk materials, and their unique characteristics are under investigation. However, using conventional methods to synthesize perovskite nanomaterials of small size and high crystallinity is difficult, and preparing them with different morphologies under environmentally friendly conditions presents an even greater challenge.

Single crystal strontium titanate is well-known photocatalyst for producing hydrogen without applying bias since it has high conduction band and chemical stability. However, the band gap of strontium titanate is in UV region similar to most perovskite materials and limits its application. Therefore, it is very important to develop a technique to fabricate the strontium titanate nanowires with visible light absorption.

SUMMARY

A general method for biomimetic mineralization of perovskite nanomaterials would present unique opportunities.

In one aspect, a method of making a nanomaterial includes forming a perovskite in the presence of a biotemplate having affinity for a metal ion.

The biotemplate can include a virus particle. The virus particle can be an M13 bacteriophage. Forming the perovskite can include forming an aqueous mixture including the biotemplate, a first inorganic ion, and a second inorganic ion. The method can further include forming an ion source including the first inorganic ion and the second inorganic ion before forming the aqueous mixture. The method can further include adjusting the pH of the aqueous mixture and incubating the aqueous mixture for a predetermined time at a predetermined temperature. The method can further include calcining the reaction products after incubating the aqueous mixture.

The perovskite can have the formula (I):

$$A_xA'_{1-x}B_yB'_{1-y}O_{3\pm\delta} \qquad (I)$$

where each of A and A', independently, is a rare earth, alkaline earth metal, or alkali metal; each of B and B', independently, is a transition metal; x is in the range of 0 to 1; y is in the range of 0 to 1; and $\delta$ is in the range of 0 to 1.

A and A', independently, can be selected from the group consisting of Mg, Ca, Sr, Ba, Pb, and Bi. B and B', independently, can be selected from the group consisting of Ti, Zr, V, Nb, Mn, Fe, Ru, Co, Rh, Ni, Pd, Pt, Al, and Mg. The perovskite can be a strontium titanate; or the perovskite can be a bismuth ferrite.

In other embodiments, the perovskite can be a tantalum oxide, tantalum oxynitride or tantalum nitride, or compounds derived therefrom. For example, the perovskite can be sodium tantalate, zirconium oxide/tantalum oxynitride, zirconium tantalum oxynitride, tantalum oxynitride, tantalum nitride, or zirconium tantalum nitride.

In another aspect, a biotemplated nanomaterial includes interconnected crystalline perovskite nanoparticles.

The nanomaterial can be elongated in shape. The nanoparticles can have a particle size of no greater than about 50 nm, no greater than about 40 nm, no greater than about 30 nm, no greater than about 20 nm, or no greater than about 10 nm. The nanomaterial can have a diameter of no greater than about 100 nm, no greater than about 80 nm, no greater than about 60 nm, no greater than about 40 nm, or no greater than about 20 nm. In some cases, the nanoparticles can have a particle size of no greater than about 10 nm, and the nanomaterial has a diameter of no greater than about 20 nm. The nanomaterial can have a length of greater than 500 nm.

The nanomaterial can include strontium titanate; or the nanomaterial can include bismuth ferrite.

In another aspect, a photocatalyst includes a biotemplated nanomaterial as described above.

In another aspect, a photovoltaic device includes a biotemplated nanomaterial as described above.

In certain embodiments, the biotemplated nanomaterials can be post-treated with ammonia gas.

Other aspects, embodiments, and features will be apparent from the following description, the drawings, and the claims.

BRIEF DESCRIPTION OF THE DRAWINGS

FIG. 2A shows a TEM image of SrTi(EG) precursor-incubated viruses. FIGS. 2B and 2C show TEM images of virus-templated STO nanowires. FIG. 2D shows a HRTEM image of virus-templated STO nanowires, and FIG. 2E shows an XRD pattern of virus-templated STO nanowires.

FIG. 14A is a schematic diagram for a liquid junction solar cell including BFO nanoparticles. FIG. 14B illustrates photovoltaic properties of a solar cell using virus-templated BFO nanoparticles as photoanode.

FIG. 17B is a graph depicting the XRD comparison between a STO without treatment and 700° C. treatment.

DETAILED DESCRIPTION

Figure 1A:
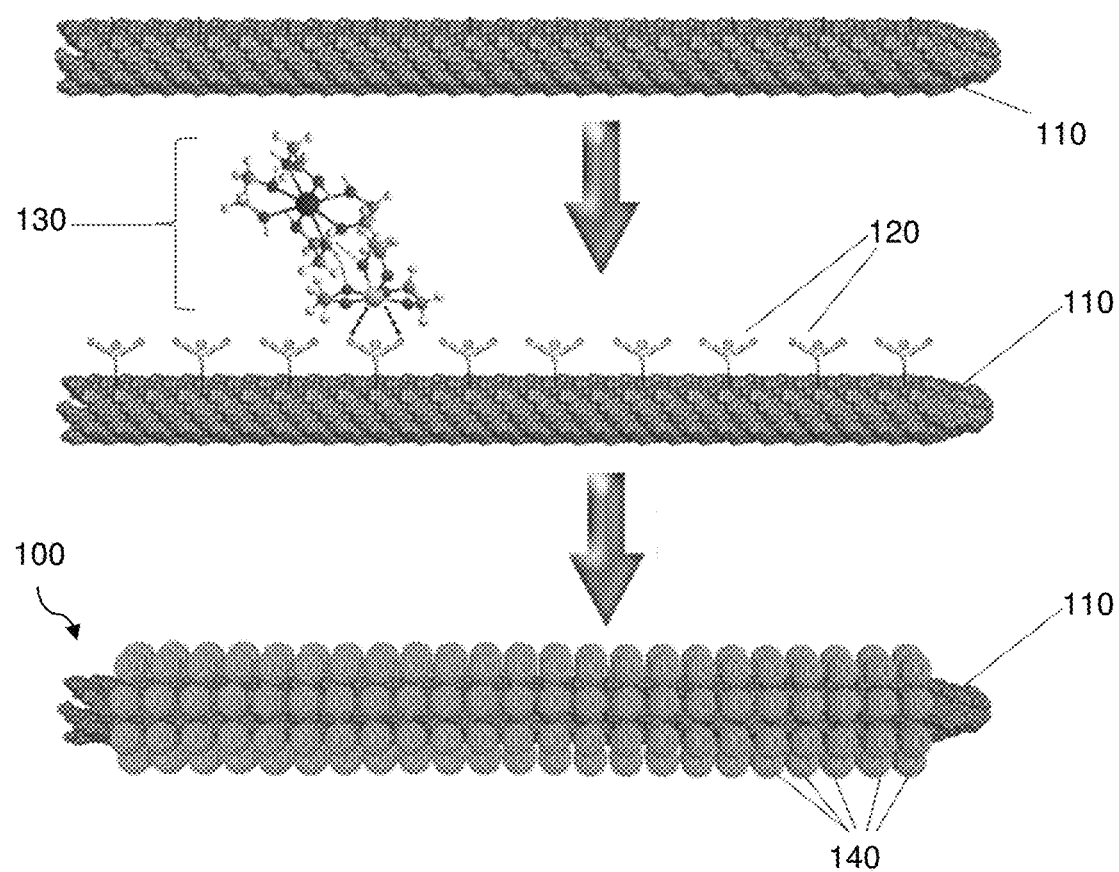
FIGS. 1A and 1B are schematic depictions of nano structures and a method of making them.

Biological systems provide an ideal environment for synthesizing natural minerals with control of morphology and crystal structure; expanding biological synthesis to non-natural materials while maintaining such control has been the focus of recent study. M13 bacteriophage is a diverse bio-template that has been genetically engineered for synthesizing nanomaterials that can be used to make functional devices. Particularly, metal, metal alloy, and semiconductor nanowires have been assembled and nucleated on M13 viruses. However, biological synthesis of ternary metal oxide nanomaterials is challenging as it requires matching reaction rates of multiple precursors.

A biotemplated nanomaterial can include an inorganic material. In making the biotemplated nanomaterial, the biotemplate can serve one or more of the following functions: serving as a nucleation site for nanoparticles of the inorganic material, and providing a nanoscale scaffold on which the nanoparticles are assembled into a larger nanostructure.

A nanomaterial is a material including particles having at least one dimension on the nanometer scale, i.e., from less than 1 nm to 1,000 nm. The particles can have any shape, e.g., spheres, rods, wires, tubes, or other regular shapes; or the particles can have irregular shapes. A nanomaterial can have one or more dimensions at the nanometer scale while one or more other dimensions is larger than the nanometer scale; for example, a nanowire can have a diameter that is measured in nanometers, and a length that is measured in micrometers.

A structural feature of the biotemplate can have affinity for the inorganic material and/or precursors of the inorganic material. This structural feature can be small in size compared to the overall biotemplate, e.g., on the molecular scale, such as approximately 1 to approximately 100 nm or approximately 1 to approximately 10 nm in size.

The biotemplate can be any nanoscale biological structure, including but not limited to a virus particle, a protein, a nucleic acid, a carbohydrate, or a cell. The biotemplate can include a complex of biological structures, for example, a complex of proteins, a complex of nucleic acids (e.g., a double stranded nucleic, or a nucleic acid nanostructure), a complex of proteins and nucleic acids, and the like.

In some cases, the biotemplate includes more than instance of a structural feature. For example, a virus particle can include many copies of a particular protein; a nucleic acid can include repeating nucleotide sequences; a protein can include a repeating structural motif; a protein complex can include multiple monomers of the same protein. The repeating structural feature can function in forming the biotemplated nanomaterial, for example, by providing a nucleation site for precursors of the inorganic material to be converted to nanoparticles, and/or for nanoparticles of the inorganic material to bind to the biotemplate.

In addition to structural features on the scale of approximately 1 to approximately 100 nm or approximately 1 to approximately 10 nm in size which can help to nucleate and/or bind nanoparticles of the inorganic material, the biotemplate can have structural features at a larger scale, such as approximately 100 nm to approximately 1,000 nm or longer. For example, the overall dimensions (e.g., length, width, and height, and/or when applicable, diameter) of the biotemplate can be at this scale. The biotemplated nanomaterial can thus include structural features at this scale. Accordingly, the biotemplated nanomaterial can include a plurality of nanoparticles of inorganic material (which may be crystalline nanoparticles), for example at a scale of approximately 1 to approximately 100 nm, approximately 1 to approximately 10 nm, or approximately 10 to approximately 100 nm in size, the nanoparticles being joined or interconnected by inorganic material, such that an aggregate nanoparticle can have dimensions of approximately 100 nm to approximately 1,000 nm or longer.

With regard to FIG. 1A, nanostructure 100 includes biotemplate 110 and a plurality of nanoparticles 140 on a surface of biotemplate 110. In making nanostructure 100, biotemplate 110 has surface groups 120 that can interact with nanoparticle precursors 130. (In FIG. 1, biotemplate 110 is labeled pVIII major coat proteins; however, as discussed below, the biotemplate is not limited to M13 virus or its pVIII major coat proteins). Under appropriate conditions, precursors 130 are converted to nanoparticles 140 on a surface of biotemplate 110.

A synthetic method of using a biotemplate to mineralize nanomaterials is described. The biotemplate can be a genetically engineered virus particle (e.g., an M13 virus particle). The nanomaterials can advantageously be a perovskite nanomaterial, such as strontium titanate (STO), bismuth ferrite (BFO), sodium tantalate ($NaTaO_3$), zirconium oxide/tantalum oxynitride (ZrO—TaON), zirconium tantalum oxynitride (Zr—TaON), tantalum oxynitride (TaON), tantalum nitride ($Ta_3N_5$), or zirconium tantalum nitride (Zr—$Ta_3N_5$).

Genetic engineering can provide a virus particle having surface groups that have affinity for nanomaterials and/or nanomaterial precursors. These surface groups provide sites for nanoparticles to nucleate and bind, i.e., they serve a templating function.

M13 bacteriophage can serve as a template for nanoparticle growth. See, for example, US Patent Application Publication No. 2011/0124488, and Ki Tae Nam, Dong-Wan Kim, P. J. Y. Science 2006, 312, 885, each of which is incorporated by reference in its entirety. Protein engineering techniques (e.g., phage display) can produce a virus that has a protein coat with binding affinity for a desired target material, e.g., an inorganic material such as a metal or a metal oxide. The protein coat protein can have a metal binding motif, which, for example, can be a negatively charged motif, e.g., tetraglutamate or a peptide with a binding affinity to a metal. For example, the motif can be a 12-amino acid peptide with a high affinity for Au. In one example, engineered M13 virus particles allowed control of the assembly of nanowires of $Co_3O_4$ with a small percentage of Au dopant. Id.

While M13 bacteriophage can have a major coat protein with a motif that binds specific metals, the motif can also block binding of other metals. For example, tetraglutamate can interact with various metal ions but blocks interaction with Au due to electrostatic repulsion. See, for example, Ki Tae Nam, Dong-Wan Kim, P. J. Y. Science 2006, 312, 885, which is incorporated by reference in its entirety.

Figure 1B:
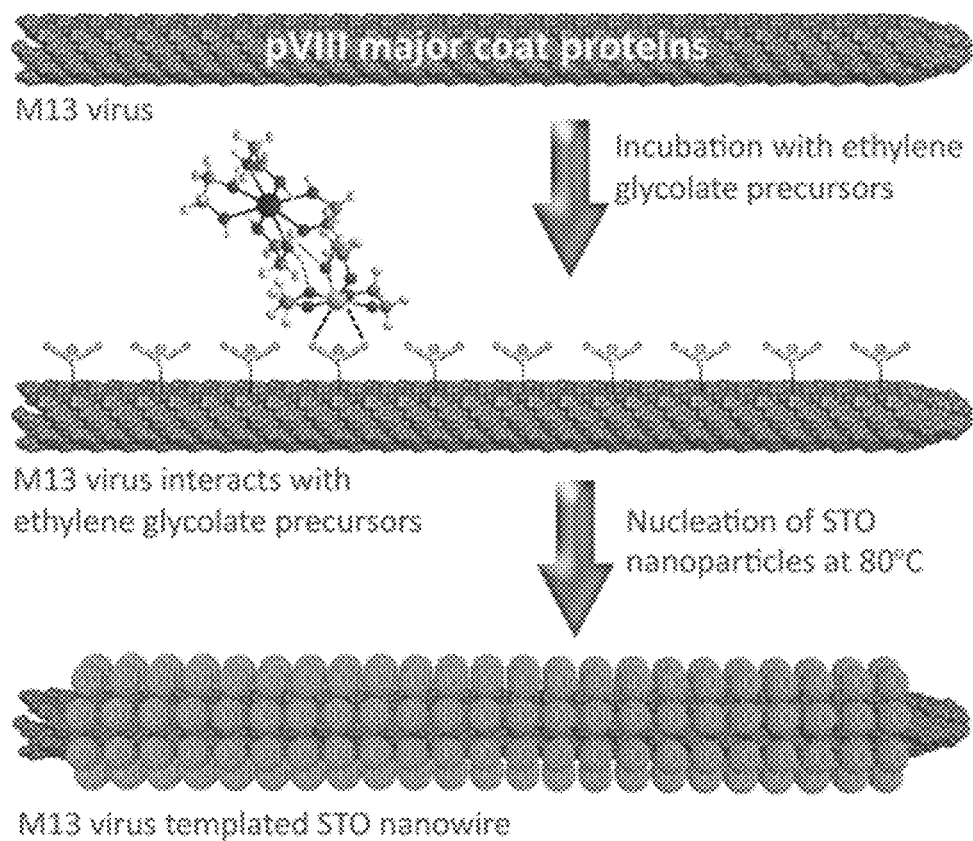

The filamentous body of M13 virus includes about 2700 identical copies of the major coat protein pVIII (FIG. 1B). Genetically engineered viruses provide effective templates for perovskite nanomaterials. In particular, when the amino acid sequence AEEE is expressed at the N-terminus of each pVIII, the result is a site with high charge density (under appropriate conditions) to interact with cationic metal precursors.

Virus-templated nanocrystals can be small in size, highly crystalline, and show photocatalytic and photovoltaic properties. Virus-templated STO nanowires catalyze production hydrogen gas efficiently under both UV and visible (with dye-sensitization) irradiation. Photovoltaic performance of virus-mineralized BFO nanoparticles is also described.

A perovskite is an inorganic material having the same crystal structure as the mineral perovskite, i.e., $CaTiO_3$. As used herein, "perovskite" refers generally to any member of the class of materials having that crystal structure, and not to the mineral specifically.

In general, a perovskite can have the formula (I):

$$A_xA'_{1-x}B_yB'_{1-y}O_{3\pm\delta} \quad (I)$$

where each of A and A', independently, is a rare earth, alkaline earth metal, or alkali metal, x is in the range of 0 to 1, each of B and B', independently, is a transition metal, y is in the range of 0 to 1, and δ is in the range of 0 to 1. δ can represent the average number of oxygen-site vacancies (i.e., –δ) or surpluses (i.e., +δ); in some cases, δ is in the range of 0 to 0.5, 0 to 0.25, 0 to 0.15, 0 to 0.1, or 0 to 0.05. For clarity, it is noted that in formula (I), B and B' do not represent the element boron, but instead are symbols that each independently represent a transition metal. In some cases, δ can be approximately zero, i.e., the number of oxygen-site vacancies or surpluses is effectively zero. The material can in some cases have the formula $AB_yB'_{1-y}O_3$ (i.e., when x is 1 and δ is 0); $A_xA'_{1-x}BO_3$ (i.e., when y is 1 and δ is 0); or $ABO_3$ (i.e., when x is 1, y is 1 and δ is 0).

Rare earth metals include Sc, Y, La, Ce, Pr, Nd, Pm, Sm, Eu, Gd, Tb, Dy, Ho, Er, Tm, Yb, or Lu. Alkaline earth metals include Be, Mg, Ca, Sr, Ba, and Ra. Alkali metals include Li, Na, K, Rb, and Cs. Transition metals include Sc, Ti, V, Cr, Mn, Fe, Co, Ni, Cu, Zn, Y, Zr, Nb, Mo, Tc, Ru, Rh, Pd, Ag, Cd, Hf, Ta, W, Re, Os, Ir, Pt, Au, or Hg. Particularly useful alkaline earth metals can include Ca, Sr, and Ba. Particularly useful transition metals can include first-row transition metals, for example, Cr, Mn, Fe, Co, Ni, and Cu. Representative materials of formula (I) include calcium titanate ($CaTiO_3$), barium titanate ($BaTiO_3$), strontium titanate ($SrTiO_3$), barium ferrite ($BaFeO_3$), $KTaO_3$, $NaNbO_3$, $PbTiO_3$, $LaMnO_3$, $SrZrO_3$, $SrHfO_3$, $SrSnO_3$, $SrFeO_3$, $BaZrO_3$, $BaHfO_3$, $KNbO_3$, $BaSnO_3$, $EuTiO_3$, $RbTaO_3$, $GdFeO_3$, $PbHfO_3$, $LaCrO_3$, $PbZrO_3$, or $LiNbO_3$.

In making the biotemplated nanomaterial, in general, a biotemplate solution (typically, an aqueous solution) is combined with inorganic precursors of a desired material. The inorganic precursors can be metal ion sources compatible with an aqueous solution, for example, salts of A, A', B, and B' atoms. Metal ion salts can be combined into a precursor composition, for example a solution including each of the metal ions to be included in the desired material, and the precursor composition then combined with the biotemplate solution. The precursors and biotemplate are then allowed to react for a period of time at a desired temperature and at a desired pH. A further incubation (e.g., at a different temperature) can also be performed. The product of this reaction can then be calcined, i.e., heated at a temperature in the range of 100-800° C. for a period of time. Calcination can reduce or remove organic material (e.g., the biotemplate) from the inorganic nanomaterial.

EXAMPLES

Synthesis of Peroskite Nanomaterials Using M13 Virus

Experimental

Strontium chloride ($SrCl_2.6H_2O$), titanium chloride ($TiCl_4$), bismuth nitrate ($Bi(NO_3)_3.5H_2O$), iron nitrate ($Fe(NO_3)_3.9H_2O$) and ethylene glycol (EG) were purchased from Sigma Aldrich. Deionized water (DI water) was used to prepare all solutions.

To prepare strontium titanium ethylene glycolate (SrTi (EG)) precursor, equal molar ratio of $SrCl_2$ and $TiCl_4$ were dissolved into ethylene glycol under continuous stirring. To prepare bismuth iron ethylene glycolate (BiFe(EG)) precursor, equal molar ratio of $Bi(NO_3)_3$ and $Fe(NO_3)_3$ were dissolved into ethylene glycol under continuous stirring. STO nanowires were synthesized by addition of SrTi(EG) precursor into virus solution. In a typical synthesis, 0.1 ml of the precursors were mixed with 10 ml of $10^{12}$ pfu (plaque forming units or number of virus particles) of virus solution at neutral pH, and then sodium hydroxide was further added to the solution and heated at 80° C. for 4 hours. In a typical synthesis of BFO, 0.1 ml of the BiFe(EG) precursor was added to 10 ml of $10^{12}$ pfu of virus solution. The solution was incubated for at least one day. Then the reactant of BiFe(EG)-incubated virus was heated at 600° C. for one hour.

Hydrogen evolution test: Photodeposition method was applied to reduce platinum ions on the surface of STO nanowires using UV-lamp. 0.5 wt % of chloroplatic acid was added to STO dispersed ethanol solution. Then the mixture was exposed to UV-lamp (100 watts) under stirring condition. 1) Under UV light: 0.05 g of STO nanowires codeposited with platinum nanoparticles (0.5 wt %) was added to 60 ml of the mixture of methanol and water (volume ratio 1:1.4). 2) Under visible light: 0.06 g of STO nanowires co-deposited with platinum nanoparticles (0.5 wt %) was added to 30 ml of 15% diethanol amine aqueous solution containing 0.5 mM Eosin Y. Then, the solution was purged with argon for at least 30 minutes. Before irradiation, gas chromatography (Agilent, 7890A, TCD, Ar carrier) was utilized to confirm the absence of oxygen and hydrogen gas in the head space. At each injection, 250 ml of gas was tested after irradiation with varied time using mercury lamp (100 watts). For visible light irradiation, a UV cut-off filter was used to block wavelengths shorter than 400 nm.

Photovoltaic performance: thin film of BFO nanoparticles (10 mm thick) was constructed by doctor-blading technique. The counter-electrode was 100-nm-thick platinum, sputtered on an ITO substrate (Delta Technologies). The electrolyte was a solution of 0.6 M 1-butyl-3-methylimidazolium iodide (Sigma Aldrich), 0.03 M $I_2$ (Sigma Aldrich), 0.10 M guanidinium thiocyanate (Sigma Aldrich) and 0.5 M 4-tert-butyl pyridine (Sigma Aldrich) in a mixture of acetonitrile and valeronitrile (volume ratio, 85:15). I-V curves of the films were measured under dark and light illumination with an AM1.5 light source (100 mW $cm^{-2}$).

Results and Discussion

In the biotemplated synthesis of STO nanowires, virus solution was first incubated with strontium titanium ethylene glycolate (SrTi(EG)) precursors. The interaction between viruses and precursors was demonstrated by using transmission electron microscopy (TEM) (FIG. 2A) which shows staining of the virus with electron dense metal cations. Then the pH of the solution was changed to pH 10 and the temperature was raised to 80° C., allowing for the hydrolysis and condensation of STO nanowires on the virus. The virus-templated STO nanowires were characterized by high resolution transmission electron microscopy (HRTEM) (FIG. 2B-2D). Each STO nanoparticle was only around 5 nm in diameter and with cubic crystalline structure. High negative charge density provided by carboxylate ions on the surface of virus favors the formation of small nanoparticles. The highly crystalline structure was also confirmed by X-ray diffraction (XRD) (FIG. 2E).

Figure 3:
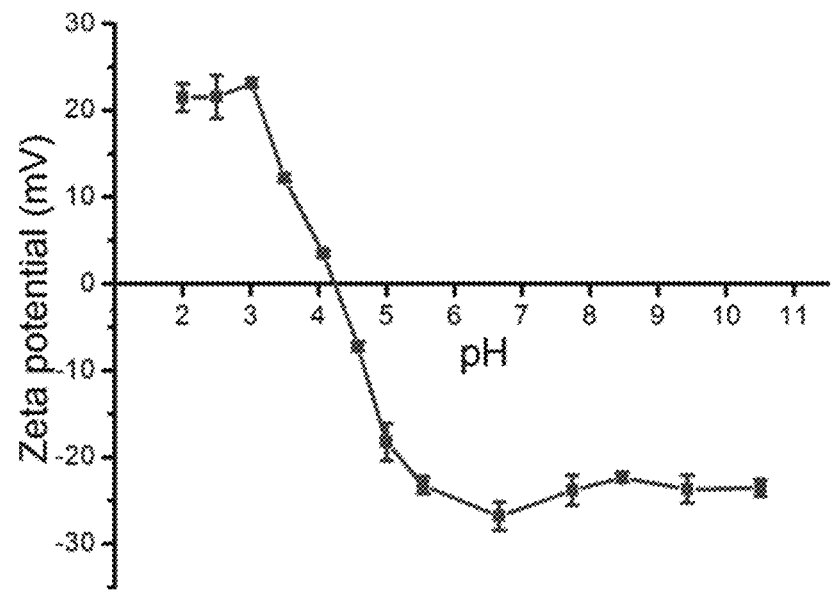
FIG. 3 is a plot showing the zeta potential of the AEEE virus at different pH values.
Figure 4:
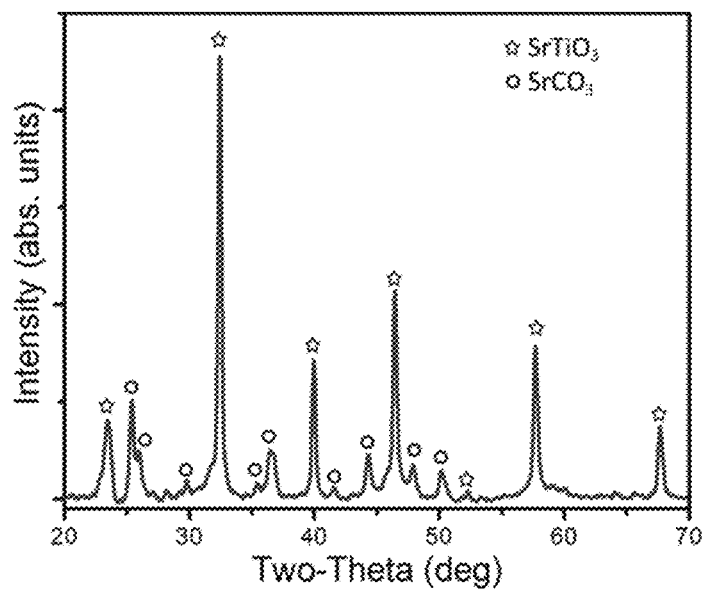
FIG. 4 shows the XRD pattern of virus-templated STO nanowires synthesized at pH 5 without adding hydrogen peroxide, containing impurities of SrCO$_3$.
Figure 5:
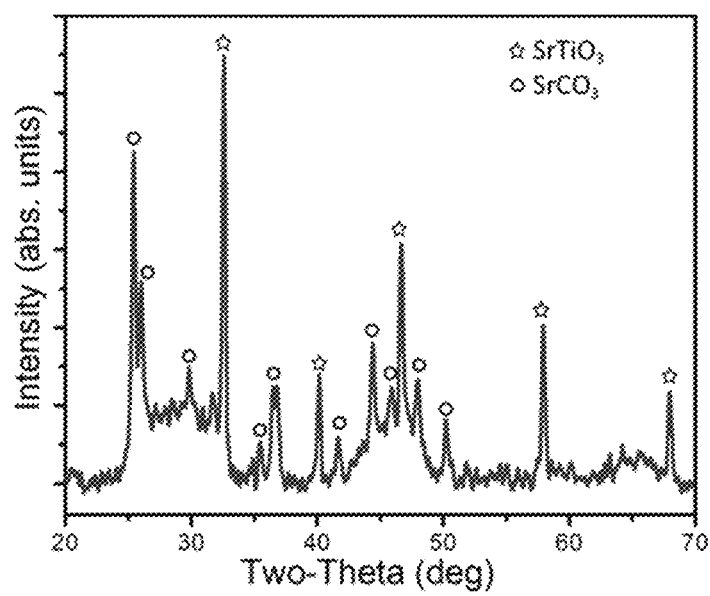
FIG. 5 XRD pattern of virus-templated STO nanowires synthesized at pH 6 without adding hydrogen peroxide, containing impurities of SrCO$_3$.
Figure 7:
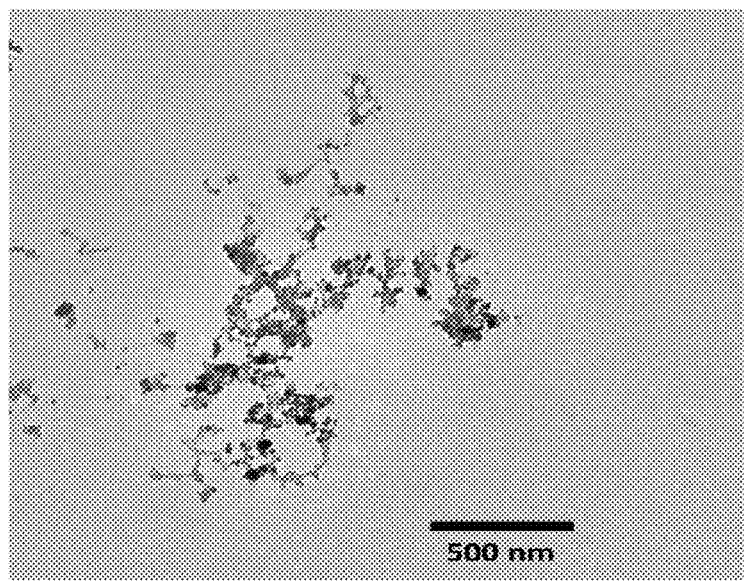
FIG. 7 is a TEM image of wild type M13 virus-templated STO nanoparticles.
Figure 8:
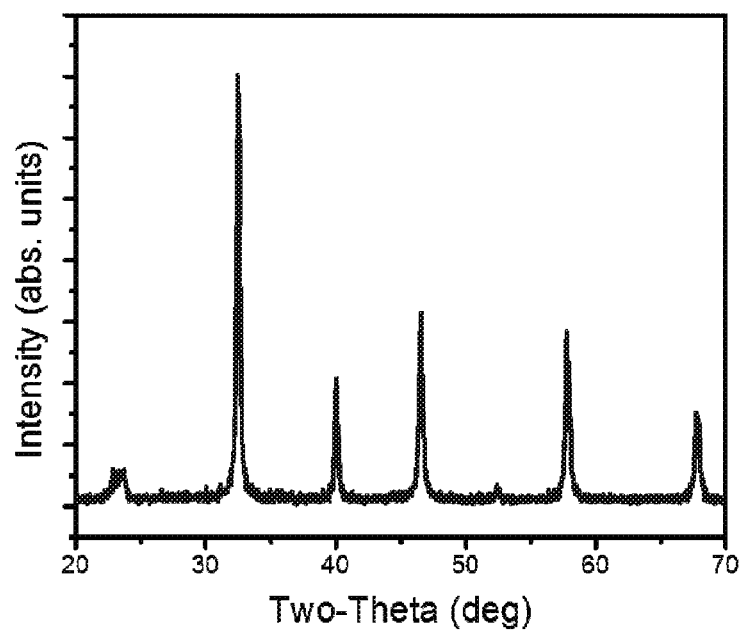
FIG. 8 shows the XRD pattern of wild type M13 virus-templated STO nanoparticles.
Figure 9:
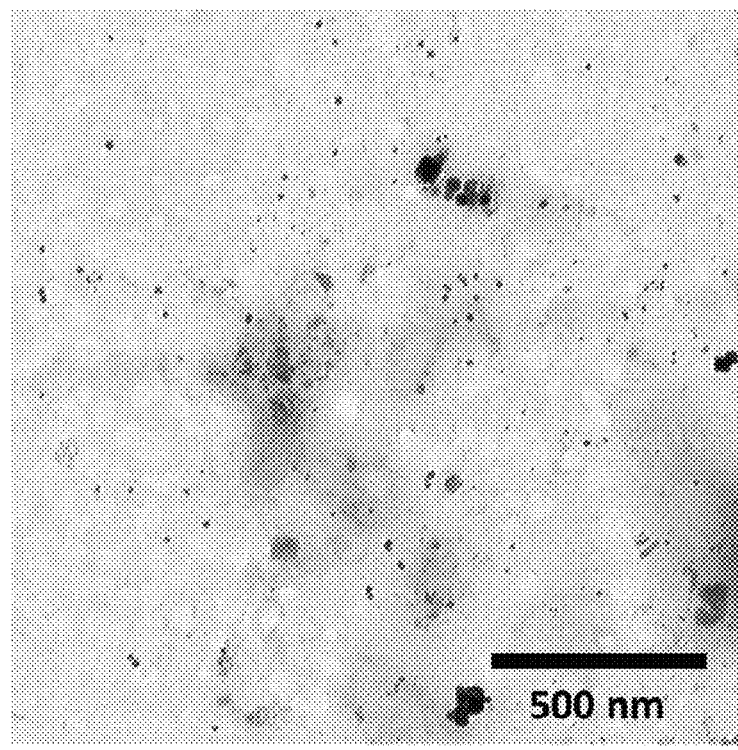
FIG. 9 is a TEM image of free STO nanoparticles without M13 virus.
Figure 10:
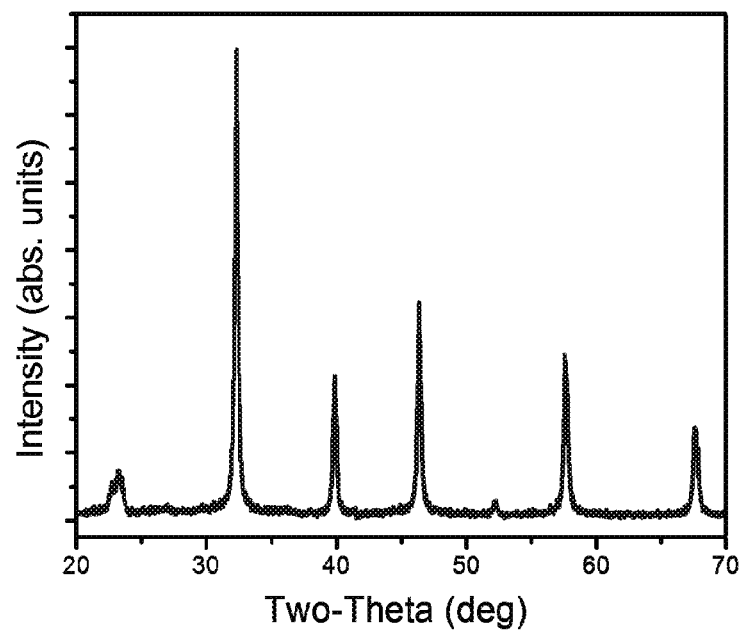
FIG. 10 shows the XRD pattern of STO nanoparticles without M13 virus.

Biotemplated synthesis of STO was optimized in terms of temperature, concentration of the precursors, and pH. At low temperatures (50° C. and 60° C.), no crystalline structure was found. The cubic crystalline structure of STO was formed at 80° C., which is the critical temperature to both accelerate the condensation and start STO nanocrystal nucleation and growth. The concentration of SrTi(EG) precursor for successful nanowire formation was between 0.1 mM and 1 mM. When the concentration of precursor was higher than 1 mM, homogeneous nucleation occurred and out-competed the virus-templating. The effect of the pH was also investigated. The zeta-potential of virus showed that the pI (isoelectric point) of AEEE virus was around 4 (FIG. 3). At pH lower than 4 the surface of the virus was positively charged, when incubated with SrTiEG precursors no stained viruses were formed indicating that there was no interaction between viruses and precursors. At pH higher than 4, the electrostatic interaction between viruses and precursors was demonstrated by increased electron density visualized on the viruses. However, at pH 5~7, due to the low hydrolysis reaction rate, both STO and strontium carbonate were observed with or without addition of oxidants (hydrogen peroxide) (FIGS. 4-5). At pH 10, the virus-templated nanowires showed only the perovskite structured STO. As the control experiments, we examined the growth of STO using non-genetically modified M13 virus (wildtype) and also performed the reactions without the addition of the virus. FIGS. 7 and 8 clearly show discrete nanoparticles grown on wild type virus, which are different from AEEE virus templated STO. Wild type virus contains fewer carboxyl groups and is less effective at nucleating STO, resulting in nanoparticles that are larger than those prepared on genetically modified virus template (AEEE). On the other hand, in the absence of the virus (FIGS. 9 and 10), nanoparticles are polydisperse and do not show wire-like assembly. Compared with several studies that showed the carboxyl groups act as the reaction sites for mineralization of perovskite materials using the ethylene glycol precursors, the results demonstrated that the AEEE-genetically modified virus, rich in carboxyl groups, serves as an ideal template for the formation of nanowires of perovskite materials.

Figure 11:
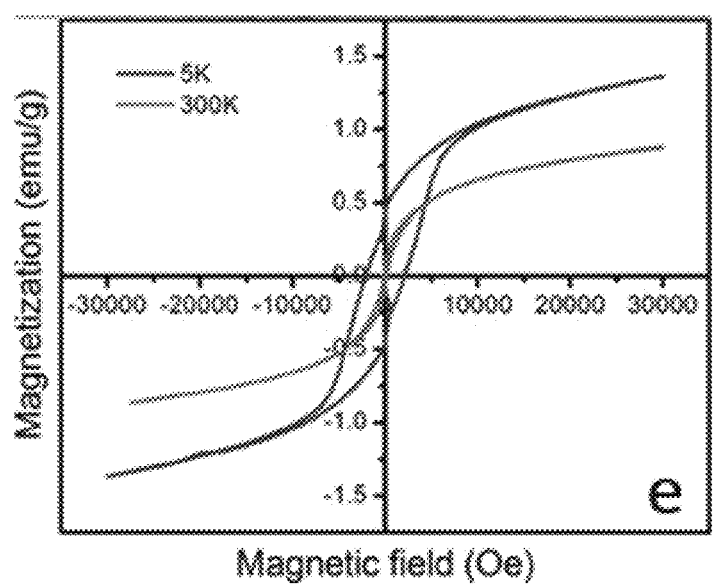
FIG. 11 shows the magnetic properties of virus-templated BFO nanoparticles at 5K and 300K.
Figures 12A, 12B:
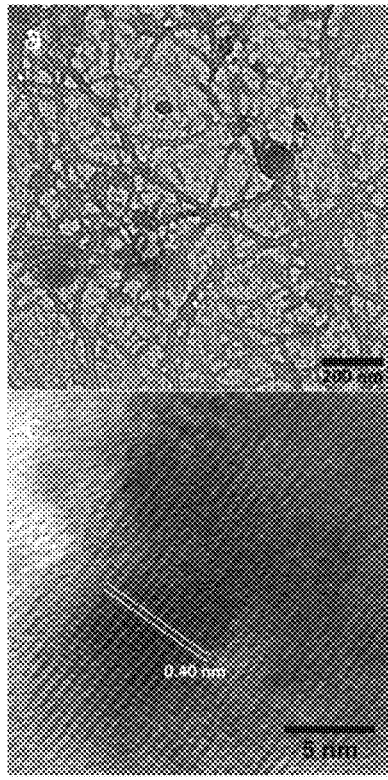
FIG. 12A shows a TEM image of BiFe(EG)-incubated viruses before heat treatment at 600° C.
FIGS. 12B-12C show HRTEM images of virus-templated BFO nanoparticles after heat treatment at 600° C.
Figures 12C, 12D:
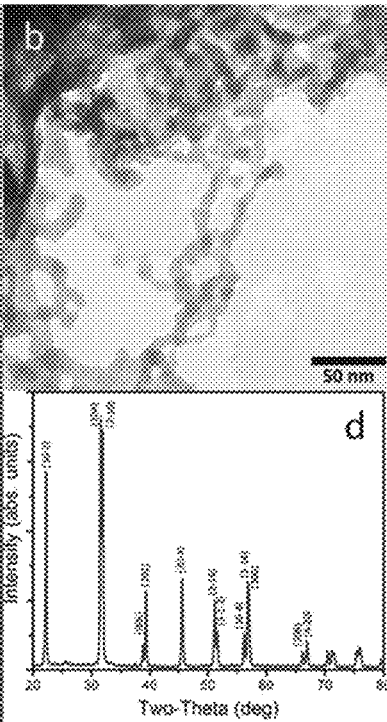
FIG. 12D shows XRD pattern of virus-templated BFO nanoparticles after heat treatment at 600° C.

To synthesize BFO nanoparticles, the virus solution was incubated with bismuth iron ethylene glycolate (BiFe(EG)) precursor. The interaction between viruses and precursors was demonstrated by TEM (FIG. 12A). Then the BiFe(EG)-incubated virus was heated at 600° C. allowing formation of BFO nanoparticles. HRTEM (FIG. 12C) and XRD (FIG. 12D) confirmed the formation of R3c crystalline structure of BFO (JCPDS no. 86-1518). The resulting virus-templated nanoparticles were between 10 and 30 nm in diameter (as measured by both TEM and XRD) which is a difficult size to obtain by conventional methods. The magnetic properties of BFO nanoparticles were characterized using superconducting quantum interference device (SQUID) (FIG. 11). The saturation magnetic moment (Ms) at 300K was 0.877 emu $g^{-1}$ at 30,000 Oe. The nanoparticles showed coercivity at 5K, with a coercive field of ±1,500 Oe.

Biotemplated synthesis of STO and BFO nanomaterials in aqueous solutions provides small particle size, different morphologies, and high crystallinity. This biotemplate technique is distinguished from conventional methods for synthesizing perovskite nanomaterials, such as sol-gel, coprecipitation, hydrothermal, and surfactant-assisted synthesis, most of which involve the use of alkoxide precursors in organic solvents and do not adequately control the size and morphology. The nanoparticles synthesized by these previous methods are amorphous, or their surfaces are passivated by surfactants. In order to make highly crystalline materials, older methods applied calcination at high temperatures, sometimes resulting in an increase of particle size, thus a decrease in catalytic activity.

Figure 13A:
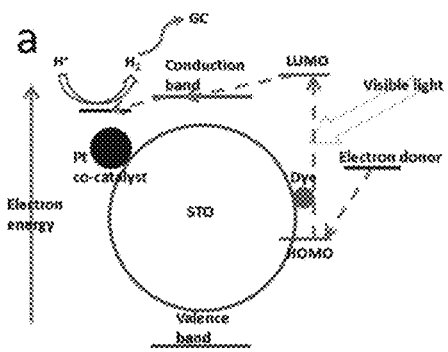
FIG. 13A is an energy band diagram for hydrogen production of dye-sensitized STO under visible light irradiation.
Figure 13B:
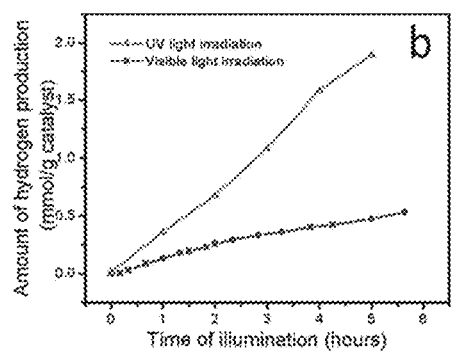
FIG. 13B illustrates hydrogen gas production by water-splitting utilizing virus-templated STO nanowires deposited with Pt nanoparticles under UV irradiation (red line) and visible light irradiation with dye-sensitization (blue line).

Recently the photocatalytic and photovoltaic performance of STO and BFO have been investigated. Single crystal STO is a wide-bandgap photocatalyst for producing hydrogen with a high conduction band level and good chemical stability. To investigate photocatalytic water reduction of biotemplated STO nanowires, the hydrogen evolution experiments were conducted using methanol as a hole scavenger and Pt nanoparticles as a co-catalyst. After STO absorbed UV light, the excited electrons in the conduction band of STO reduced hydrogen ions to produce hydrogen gas at the Pt particle active sites, while the holes on the valence band of STO were recovered by methanol. The amount of evolved hydrogen was measured by gas chromatography (GC) at several time points (FIG. 13B). The hydrogen evolution rate of STO nanowire was 370 mmol $g^{-1}$ $hour^{-1}$, which is around ten times higher than that of titania (Degussa, P-25), and commercial STO nanopowders (Wako Pure Chemical Industries, Ltd.) (37 and 46 mmol $g^{-1}$ $hour^{-1}$, respectively). The improved performance of virus-templated STO nanoparticles was believed to arise from the smaller particle size, providing a larger surface to volume ratio, and the high crystallinity, preventing charge recombination at lattice defect sites. To produce hydrogen under visible light irradiation, Eosin Y dye was used to sensitize STO nanowires loaded with Pt nanoparticles (FIG. 13A). The photo-electrons were excited to the lowest unoccupied molecular orbital (LUMO) of the dye and then transfer to the conduction band of STO. Hydrogen was produced at the Pt particle active sites. Diethanolamine is used to regenerate the electron deficient dye.

Figure 6:
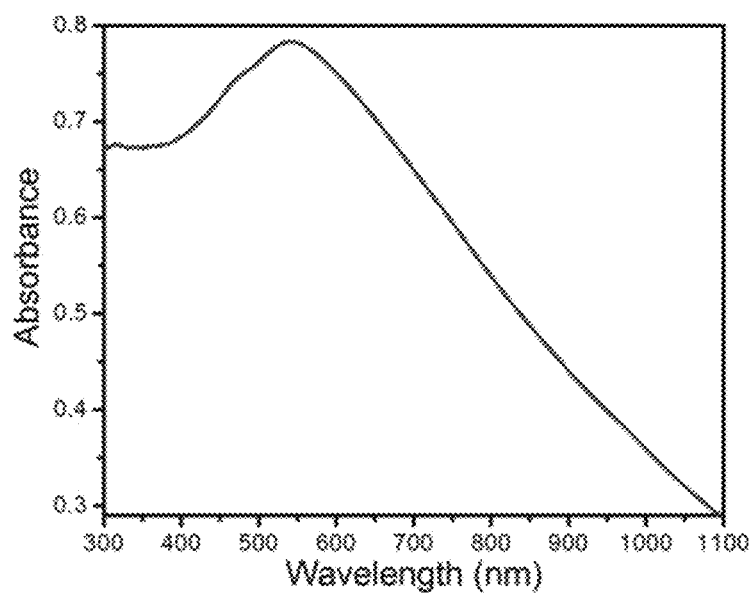
FIG. 6 shows an optical absorption spectrum of virus-templated BFO nanoparticles.

BFO is a highly sought-after material for photovoltaic applications. Most perovskite materials primarily absorb UV light, harvesting solar energy inefficiently. In contrast, BFO has attracted increasing attention due to a direct band gap corresponding to visible light. The photovoltaic properties of single crystal and thin film BFO have been observed. However, the photovoltaic effect of BFO nanoparticles has not been investigated. The absorption spectrum of virus-templated BFO nanoparticles showed a broad feature with peak around 550 nm (FIG. 6), absorbing visible light effectively. Photovoltaic properties of virus-templated BFO nanoparticles were characterized by fabricating liquid junction solar cells (FIG. 14A). Under illumination of an AM1.5 solar simulator at 100 mW cm$^{-2}$, an open circuit voltage of 0.578 V and a short circuit current density of 0.735 mA cm$^{-2}$ were observed (FIG. 14B), achieving solar power conversion efficiency of 0.17% (the fill factor of the device was 0.40). The BFO-liquid junction photovoltaic device is the first report of BFO nanoparticles based solid-liquid junction PV devices.

In summary, biotemplates provide a general approach to synthesize perovskite nanomaterials in an aqueous system; a genetically engineered M13 virus can be useful as the biotemplate. STO and BFO nanoparticles were successfully templated, achieving small particle size and high crystallinity, and demonstrating photocatalytic and photovoltaic properties.

Post-Treatment of Perovskite Nanomaterials for Solar Active Photocatalysts

Ammonia ($NH_3$) Gas Treatment for STO

In addition to using dye as a mediator of visible light absorption, the following technique to fabricate photoactive catalysts was used. STO particles are doped by nitrogen content at the surface by treating with $NH_3$ under various high temperatures in between 500° C.-1000° C. Hence, the valence band position shifts upward and decreases the band gap.

Figure 15:
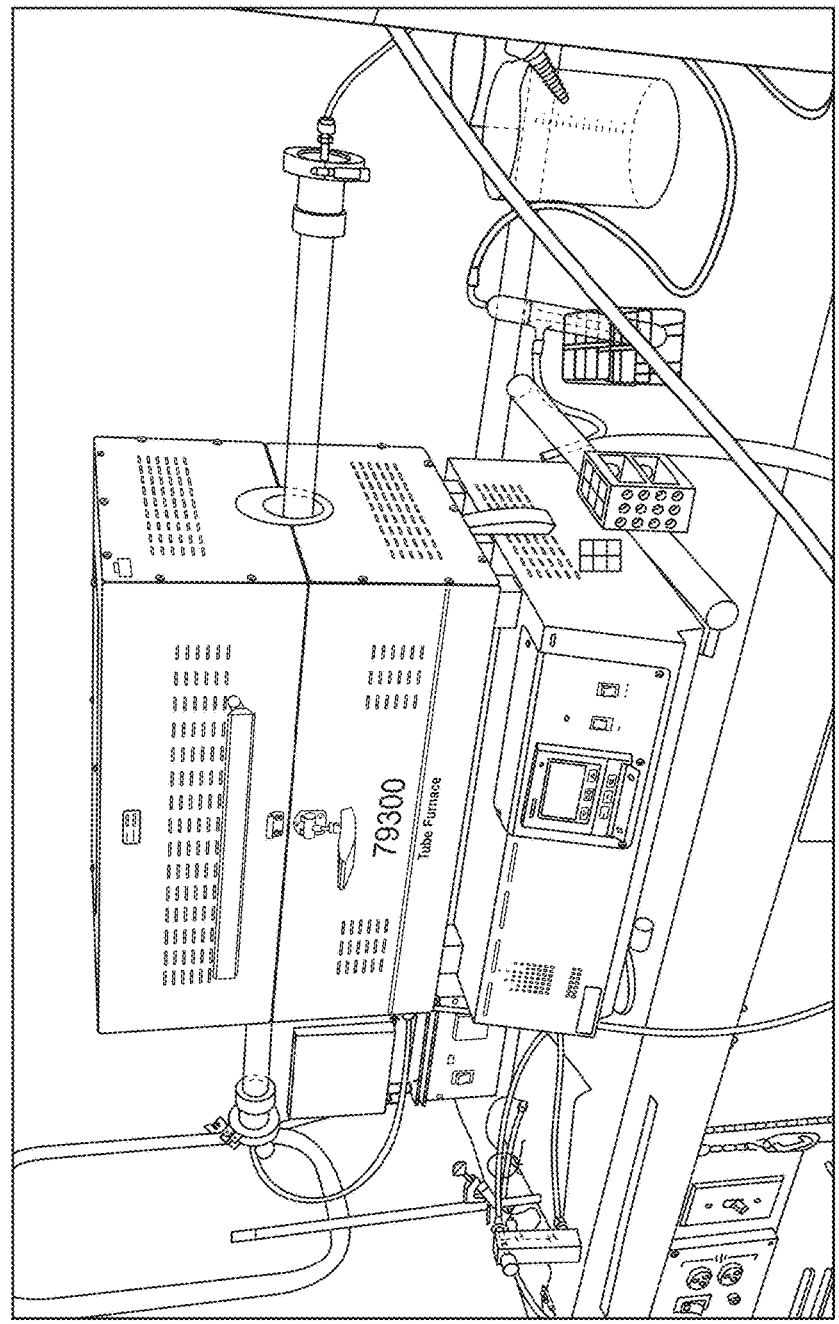
FIG. 15 is a photograph depicting the equipment for the post-treatment of biotemplated nanomaterials using ammonia gas flow.

FIG. 15 shows the assembly of post-treatment of nanomaterials in the furnace through ammonia gas flow. For the post-treatment, the nanoparticle powders, which are synthesized by virus template, are placed inside of crucible. Then the crucible are inserted and placed in the middle of quartz long tube. The two ends of the quartz tube are connected into a gas line. One end connects to a gas inlet, and the other end connects to an outlet which is immersed into a container including saturated sodium bicarbonate or other buffer solutions. The inlet line connects to gas flow meter which is used to control the gas flow. In this procedure, before rising temperature, the furnace containing quartz tube is flowed by ammonia gas at the rate of 50 ml/min for one hour. Then the temperature is programmed to gradually rise to a desirable temperature with a rate of 5° C./min while rise the gas flow rate to 200 ml/min. During the treatment, the powder is kept for at least four hours with the ammonia gas flow rate of 200 ml/min. In the cooling step, the same flow rate should be maintained until reaching the room temperature.

Figure 16:
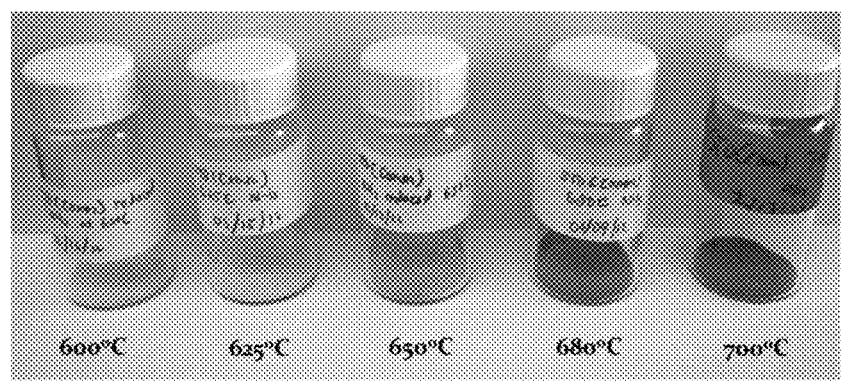
FIG. 16 is a photograph of the comparison between various STO products after treated by ammonia.

Because at various temperatures the doped nitrogen concentrations are different, the colors of processed STO are varied from light yellow to dark green (FIG. 16).

Figure 17A:
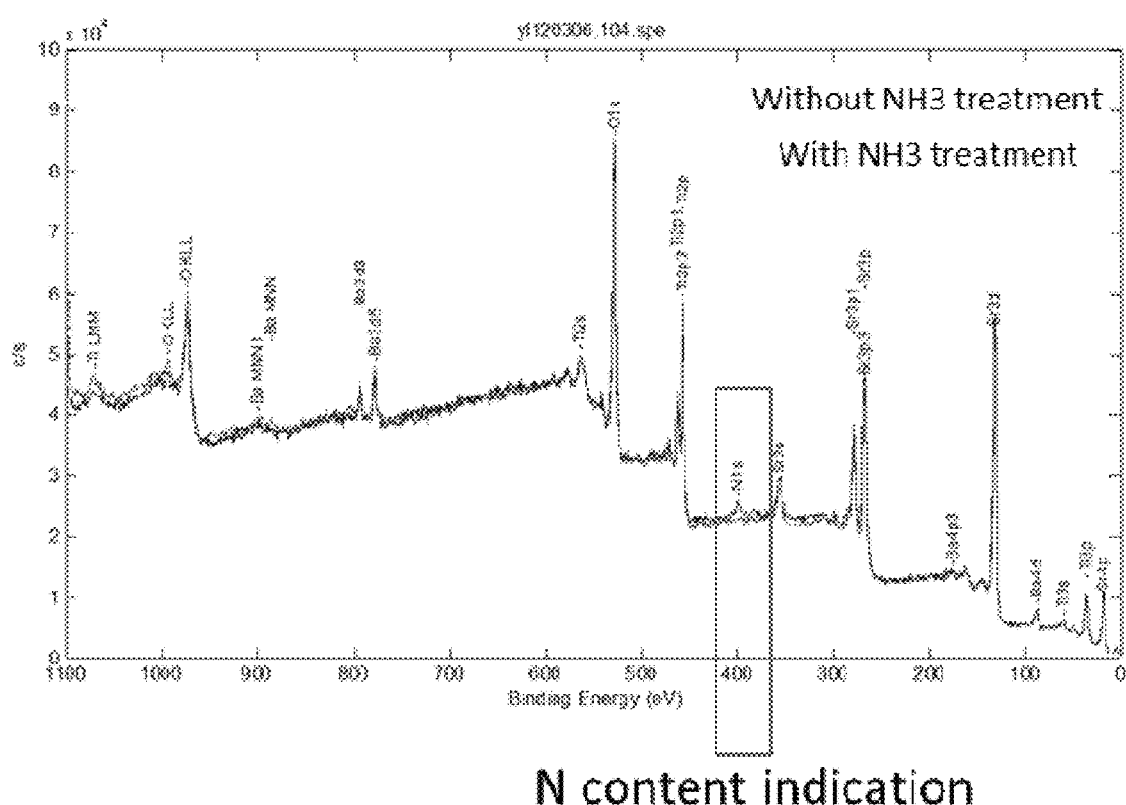
FIG. 17A is a graph depicting the XPS result confirms nitrogen doping onto the STO surface.

STO particles without the treatment of $NH_3$ and the treatment of $NH_3$ at 700° C. are compared in XRD. The result indicates no phase transformation and simple cubic structure is preserved when the sample is treated at the high temperature (FIG. 17B). XPS is conducted to examine the surface composition. We detect the presence of nitrogen content (FIG. 3-a highlighted by green box). Hence, we believe the effect of nitrogen doping will facilitate the hydrogen evolution in the visible light absorption experiment.

Figure 18:
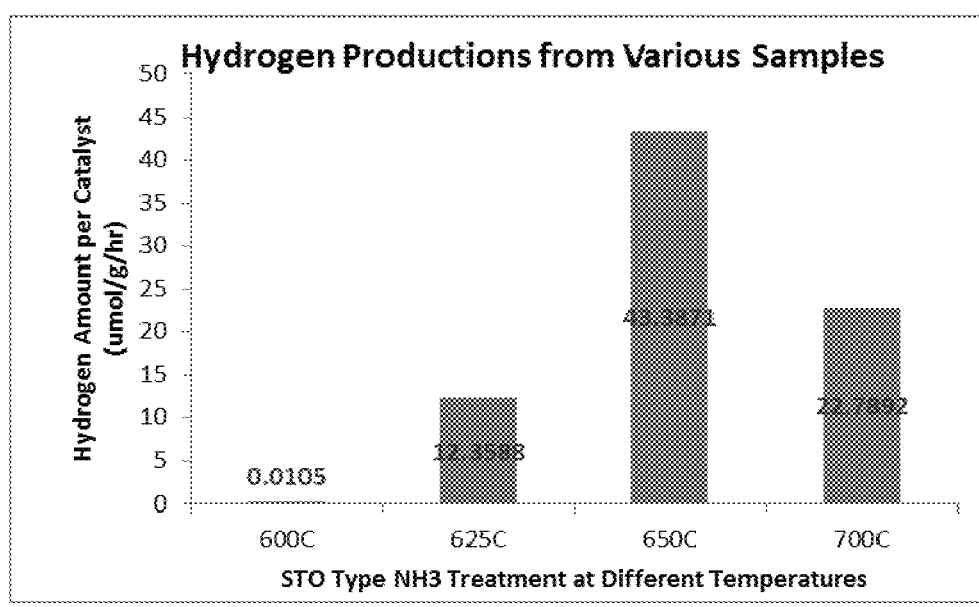
FIG. 18 is a graph depicting the hydrogen evolutions based on various temperatures of treatment under visible light.

Compared to literatures, the commercial photocatalyst have reached the best results of 28.7 µmol/g/hr, which is lower than our best result of 43.4 µmol/g/hr. Although this result stays behind the option of using dye, in the non-optimized system we have seen the promising result by adjusting temperatures. Shown as FIG. 18, at temperature of 650° C., the hydrogen evolution is superior to other temperature conditions. The doping with proper amount of nitrogen content could shrink the band gap and increase the photocatalytic effect. However, too much doping at higher temperature could lead to the surface morphology change and lead to the decreasing effect of photocatalytic reaction shown by other temperature conditions.

Ammonia ($NH_3$) Gas Treatment for Tantalum Materials

Figure 19:
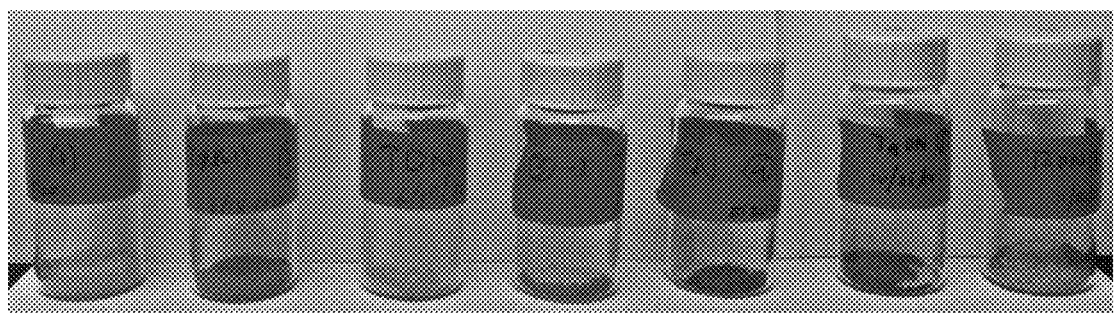
FIG. 19 is a photograph depicting various tantalum materials.

Similar ammonia treatment technique can be applied to various tantalum perovskite nanomaterials, including $NaTaO_3$, ZrO—TaON, Zr—TaON, TaON, $Ta_3N_5$, and Zr—$Ta_3N_5$. Several virus-template tantalum perovskite materials have been synthesized to demonstrate the feasibilities of nitrogen doping shown in FIG. 19. Different colors are displayed on the samples because of the different chemical compositions.

Figure 20:
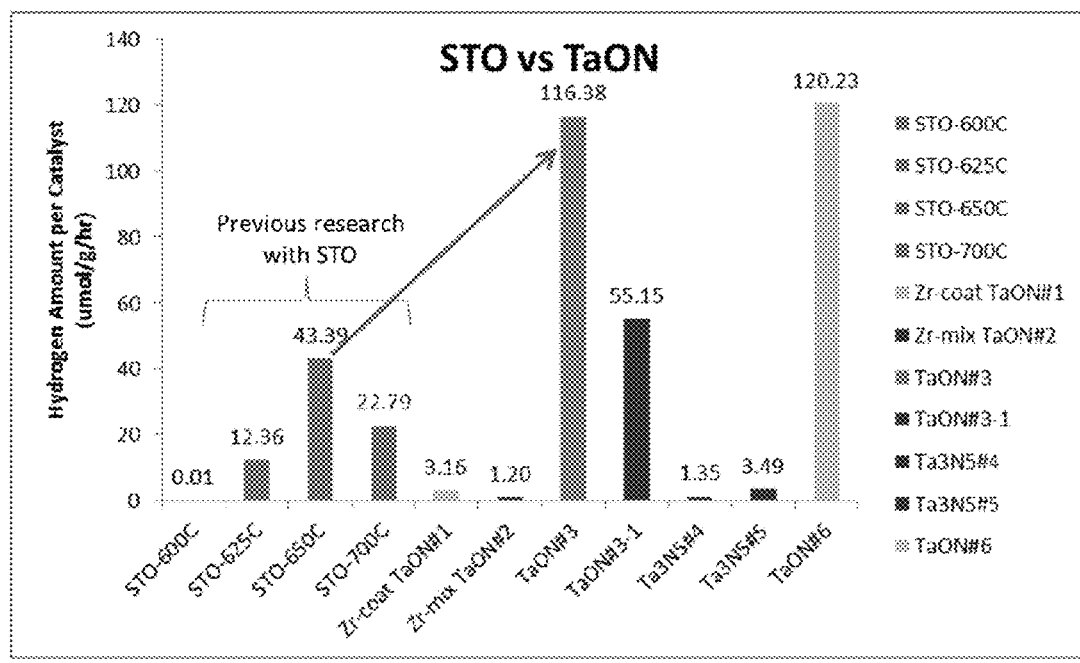
FIG. 20 is a graph depicting the hydrogen evolutions based on various tantalum materials under visible light.

Tantalum nanomaterials show excellent performances of making more hydrogen rapidly. Among various tantalum materials, TaON is a better hydrogen-producing material than others and STO as shown in FIG. 20. The hydrogen evolving reaction occurs in the system of tantalum photocatalytic materials irradiated under visible light in water and ruthenium dye.

Figure 21:
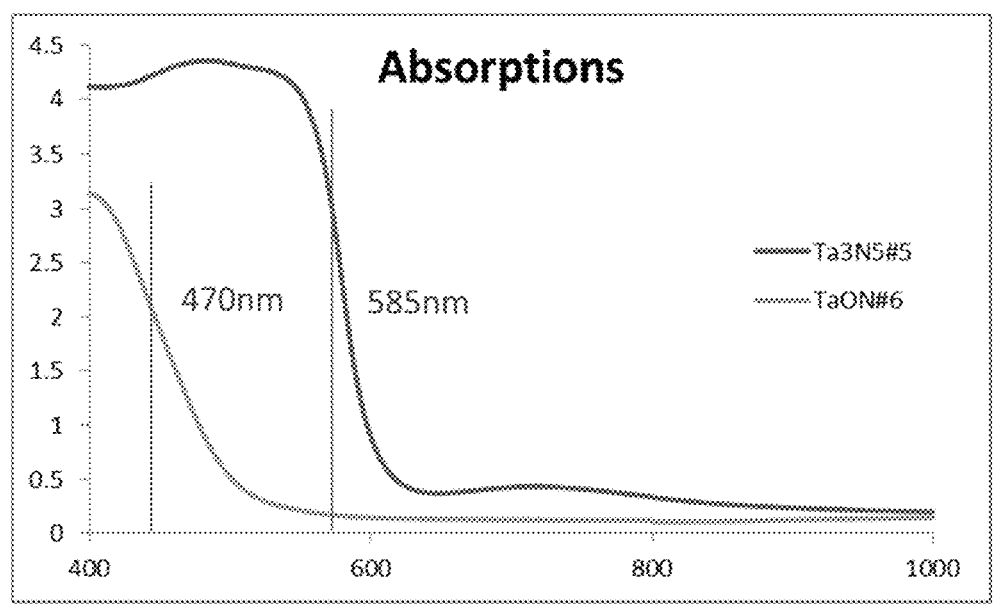
FIG. 21 is a graph depicting the absorption spectrum for $Ta_3N_5$ and TaON.

XRD tests have been conducted to confirm different crystallinities of $Ta_3N_5$ and TaON. The band gaps of both materials are different and lead to the distinct absorption spectrum shown in FIG. 21.

In summary, Ammonia post-treatment technique was developed for fabrication of visible-light active perovskite nanomaterials. As a solar active photocatalyst, strontium titanate nanoparticles after ammonia treatment produced hydrogen gas under the visible-light irradiation. As a solar active photocatalyst, tantalum nanoparticles after ammonia treatment produced hydrogen gas under the visible-light irradiation. XRD results proved that strontium titanate possesses perovskite structure after ammonia treatment. XPS results indicated the existence of nitrogen doping in perovskite strontium titanate. There are possible applications for converting carbon dioxide into fuels under solar irradiation.

REFERENCES

Each of the following references is incorporated by reference in its entirety.

[1] A. M. Belcher, X. H. Wu, R. J. Christensen, P. K. Hansma, G. D. Stucky, D. E. Morse, *Nature* 1996, 381, 56.

[2] J. N. Cha, G. D. Stucky, D. E. Morse, T. J. Deming, *Nature* 2000, 403, 289.

[3] R. R. Naik, S. J. Stringer, G. Agarwal, S. E. Jones, M. O. Stone, *Nature Mater.* 2002, 1, 169.

[4] N. Nuraje, K. Su, A. Haboosheh, J. Samson, E. P. Manning, N. l. Yang, H. Matsui, *Adv. Mater.* 2006, 18, 807.

[5] M. B. Dickerson, K. H. Sandhage, R. R. Naik, *Chem. Rev.* 2008, 108, 4935.

[6] S. M. Selbach, M.-A. Einarsrud, T. Tybell, T. Grande, *J. Am. Ceram. Soc.* 2007, 90, 3430.

[7] R. L. Brutchey, E. S. Yoo, D. E. Morse, *J. Am. Chem. Soc.* 2006, 128, 10288.

[8] A. R. Tao, K. Niesz, D. E. Morse, *J. Mater. Chem.* 2010, 20, 7916.

[9] C. Mao, D. J. Solis, B. D. Reiss, S. T. Kottmann, R. Y. Sweeney, A. Hayhurst, G. Georgiou, B. Iverson, A. M. Belcher, *Science* 2004, 303, 213.

[10] Y. Huang, C.-Y. Chiang, S. K. Lee, Y. Gao, E. L. Hu, J. D. Yoreo, A. M. Belcher, *Nano Lett.* 2005, 5, 1429.

[11] K. T. Nam, D.-W. Kim, P. J. Yoo, C.-Y. Chiang, N. Meethong, P. T. Hammond, Y.-M. Chiang, A. M. Belcher, *Science* 2006, 312, 885.

[12] M. S. Wrighton, A. B. Ellis, P. T. Wolczanski, D. L. Morse, H. B. Abrahamson, D. S. Ginley, *J. Am. Chem. Soc.* 1976, 98, 2774.

[13] N. Reyren, S. Thiel, A. D. Caviglia, L. F. Kourkoutis, G. Hammerl, C. Richter, C. W. Schneider, T. Kopp, A.-S. Rüetschi, D. Jaccard, M. Gabay, D. A. Muller, J.-M. Triscone, J. Mannhart, *Science* 2007, 317, 1196.

[14] D. Flahaut, T. Mihara, R. Funahashi, N. Nabeshima, K. Lee, H. Ohta, K. Koumoto, *J. Appl. Phys.* 2006, 100, 084911.

[15] S. B. Adler, *Chem. Rev.* 2004, 104, 4791.

[16] D. D. Fong, G. B. Stephenson, S. K. Streiffer, J. A. Eastman, O. Auciello, P. H. Fuoss, C. Thompson, *Science* 2004, 304, 1650.

[17] J. Junquera, P. Ghosez, *Nature* 2003, 422, 506.

[18] C. H. Ahn, K. M. Rabe, J.-M. Triscone, *Science* 2004, 303, 488.

[19] M. H. Frey, D. A. Payne, *Chem. Mater.* 1995, 7, 123.

[20] J.-H. Xu, H. Ke, D.-C. Jia, W. Wang, Y. Zhou, *J. Alloys Compd.* 2009, 472, 473.

[21] Z. Liu, Y. Qi, C. Lu, *J. Mater. Sci.: Mater. Electron.* 2010, 21, 380.

[22] M. H. Um, H. Kumazawa, *J. Mater. Sci.* 2000, 35, 1295.

[23] Y. Mao, S. Banerjee, S. S. Wong, *Chem. Commun.* 2003, 408.

[24] S. O'Brien, L. Brus, C. B. Murray, *J. Am. Chem. Soc.* 2001, 123, 12085.

[25] X. Lu, J. Xie, Y. Song, J. Lin, *J. Mater. Sci.* 2007, 42, 6824.

[26] T. Puangpetch, T. Sreethawong, S. Yoshikawa, S. Chavadej, *J. Mol. Catal. A: Chem.* 2009, 312, 97.

[27] S. Y. Yang, Seidel J, S. J. Byrnes, Shafer P, C. H. Yang, M. D. Rossell, Yu P, Y. H. Chu, J. F. Scott, J. W. Ager, L. W. Martin, Ramesh R, *Nature Nanotech.* 2010, 5, 143.

[28] T. Choi, S. Lee, Y. J. Choi, V. Kiryukhin, S.-W. Cheong, *Science* 2009, 324, 63.

[29] M. Alexe, D. Hesse, *Nat. Commun.* 2011, 2, 256.

[30] X. Zhang, Z. Jin, Y. Li, S. Li, G. Lu, *Appl. Surf. Sci.* 2008, 254, 4452.

Other embodiments are within the scope of the following claims.

What is claimed is:

1. A method of making a perovskite nanomaterial comprising:
   combining an aqueous solution of a biotemplate having affinity for a metal ion and an inorganic precursor of a perovskite material to form an aqueous mixture, and
   reacting the inorganic precursor and the biotemplate to form the perovskite nanomaterial,
   wherein the perovskite comprises strontium titanate, or bismuth ferrite.

2. The method of claim 1, wherein the biotemplate includes a virus particle.

3. The method of claim 2, wherein the virus particle is an M13 bacteriophage.

4. The method of claim 1, wherein the inorganic precursor comprises a first inorganic ion and a second inorganic ion.

5. The method of claim 4, further comprising forming an ion source including the first inorganic ion and the second inorganic ion before forming the aqueous mixture.

6. The method of claim 4, further comprising adjusting the pH of the aqueous mixture and incubating the aqueous mixture for a predetermined time at a predetermined temperature.

7. The method of claim 4, further comprising incubating the aqueous mixture and then calcining the reaction products.

8. A method of making a perovskite nanomaterial comprising:
   combining an aqueous solution of a biotemplate having affinity for a metal ion and an inorganic precursor of a perovskite material to form an aqueous mixture, and
   reacting the inorganic precursor and the biotemplate to form the perovskite nanomaterial,
   wherein the perovskite has the formula (I):

$$A_xA'_{1-x}B_yB'_{1-y}O_{3\pm\delta} \qquad (I)$$

wherein
   each of A and A', independently, are selected from the group consisting of Mg, Pb, and Bi;
   each of B and B', independently, are selected from the group consisting of Zr, V, Nb, Mn, Fe, Ru, Rh, Ni, Pd, Pt, Al, and Mg;
   x is in the range of 0 to 1;
   y is in the range of 0 to 1; and
   δ is in the range of 0 to 1.

9. The method of claim 8, wherein the perovskite is a bismuth ferrite.

10. The method of claim 8, wherein the perovskite is heated to at least 600° C.

11. The method of claim 8, wherein the post-treated nanomaterials are solar active.

12. The method of claim 8, wherein the inorganic precursor comprises a first inorganic ion and a second inorganic ion.

* * * * *